United States Patent
Shimoji et al.

(10) Patent No.: US 8,018,137 B2
(45) Date of Patent: Sep. 13, 2011

(54) ORGANIC EL ELEMENT, ORGANIC EL DISPLAY DEVICE, AND PROCESS FOR PRODUCING ORGANIC EL ELEMENT

(75) Inventors: Noriyuki Shimoji, Kyoto (JP); Masato Moriwake, Kyoto (JP); Takaaki Fuchikami, Kyoto (JP); Hiroki Kato, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 686 days.

(21) Appl. No.: 11/921,802

(22) PCT Filed: Jun. 6, 2006

(86) PCT No.: PCT/JP2006/311295
§ 371 (c)(1),
(2), (4) Date: Mar. 17, 2008

(87) PCT Pub. No.: WO2006/132226
PCT Pub. Date: Dec. 14, 2006

(65) Prior Publication Data
US 2009/0102358 A1   Apr. 23, 2009

(30) Foreign Application Priority Data
Jun. 9, 2005 (JP) .................................. 2005-169212

(51) Int. Cl.
*H01L 51/00* (2006.01)
(52) U.S. Cl. ............................ 313/503; 313/506; 445/24
(58) Field of Classification Search .......... 313/498–512; 445/24–25
See application file for complete search history.

(56) References Cited

U.S. PATENT DOCUMENTS

| 4,885,211 | A | 12/1989 | Tang et al. |
| 5,652,067 | A * | 7/1997 | Ito et al. ........................ 428/690 |
| 5,937,272 | A * | 8/1999 | Tang ............................... 438/30 |
| 6,420,055 | B1 | 7/2002 | Ueda et al. |
| 6,969,291 | B2 | 11/2005 | Urabe et al. |
| 2003/0137241 | A1* | 7/2003 | Fujita et al. .................... 313/504 |
| 2005/0106419 | A1* | 5/2005 | Endoh et al. ................... 428/690 |
| 2006/0049745 | A1 | 3/2006 | Handa et al. |

FOREIGN PATENT DOCUMENTS

| JP | 2-15595 | 1/1990 |
| JP | 11-111467 | 4/1999 |
| JP | 2001-148291 | 5/2001 |
| JP | 2003-45673 | 2/2003 |
| JP | 2004-79422 | 3/2004 |
| JP | 2004-247106 | 9/2004 |
| JP | 2004-303724 | 10/2004 |
| JP | 2004-310069 | 11/2004 |

OTHER PUBLICATIONS

International Search Report from the corresponding PCT/JP2006/311295, mailed Sep. 12, 2006.

* cited by examiner

*Primary Examiner* — Anne Hines
(74) *Attorney, Agent, or Firm* — Hamre, Schumann, Mueller & Larson, P.C.

(57) ABSTRACT

An organic EL element (A1) includes an anode (2) and a cathode (4) which are arranged opposite to each other, and an organic layer (3) intervening between the anode (2) and the cathode (4) and including a light emitting layer (3b). The cathode (4) is made of MgAg alloy and has a thickness of not more than 200 Å. Preferably, the thickness of the cathode (4) is in the range of 40 to 100 Å.

17 Claims, 10 Drawing Sheets

ORGANIC EL ELEMENT, ORGANIC EL DISPLAY DEVICE, AND PROCESS FOR PRODUCING ORGANIC EL ELEMENT

TECHNICAL FIELD

The present invention relates to an organic EL (electroluminescent) element. The present invention also relates to an organic EL display using an organic EL element, and to a method for manufacturing an organic EL element.

BACKGROUND ART

FIG. 14 shows a conventional organic EL element disclosed in the Patent Document 1 described below. The organic EL element X is formed on a transparent substrate 91 and includes a reflection film 92, an anode 93, an organic layer 94 and a cathode 95. The reflection film 92 is made of metal. The anode 93 is a multilayer transparent electrode. The organic layer 94 comprises a hole injection layer 94a, a hole transporting layer 94b, a light emitting layer 94c, an electron transporting layer 94d and an electron injection layer 94e. The cathode 95 is a transparent electrode.

When a voltage is applied between the anode 93 and the cathode 93, the light emitting layer 94c positioned between these emits light. The light directed upward in the figure passes through the cathode 95 to exit to the upper side of the organic EL element X. On the other hand, the light directed downward in the figure passes through the anode 93 and is reflected by the reflection film 92. The light then passes through the anode 93, the organic layer 94 and the cathode 93 to finally exit to the upper side of the organic EL element X. In this way, the organic EL element X emits light to the side opposite from the transparent substrate 91 located on the lower side. This structure is called a top emission type.

Generally, the cathode 93 is formed by performing sputtering, molecular beam epitaxy (hereinafter referred to as "MBE") or ion plating with respect to the material such as ITO (Indium Tin Oxide) or IZO (Indium Zinc Oxide) In these techniques, however, the organic layer 94 is heated to a high temperature exceeding 100° C. Thus, the organic layer 94 may be damaged chemically. Further, in the above-described techniques, the particles such as atoms, molecules or ions constituting ITO or IZO are caused to hit against the organic layer 94. Thus, the organic layer 94 inevitably receives physical damages. These damages may lead to abnormality of the characteristics of the organic EL element such as an increase in power consumption or a decrease in luminance.

Patent Document 1: JP-A-2004-247106

DISCLOSURE OF THE INVENTION

The present invention has been proposed under the above-described circumstances. It is therefore an object of the present invention is to provide an organic EL element that exhibits low-power consumption and high luminance by preventing damage to the organic layer in the manufacturing process. Another object of the present invention is to provide an organic EL display using such an organic EL element and a method for manufacturing such an organic EL element.

According to a first aspect of the present invention, there is provided an organic EL element comprising an anode and a cathode which are arranged to face each other, and an organic layer arranged between the anode and the cathode, where the organic layer includes a light emitting layer. The cathode is made of MgAg alloy and has a thickness of not more than 200 Å.

With this arrangement, the work function of the cathode is lower than that of a cathode made of ITO, for example. Thus, the electron injection efficiency from the cathode into the organic layer is enhanced, so that the power consumption of the organic EL element is reduced. Further, the light emitted from the light emitting layer properly passes through the cathode, whereby high luminance of the organic EL element is achieved. Since the cathode can be formed by co-deposition using Mg and Ag as the deposition source, damages to the organic layer are prevented.

In a preferred embodiment of the present invention, the cathode has a thickness of 40 to 100 Å. With this arrangement, the sheet resistance of the cathode is reduced, while the transmittance of the cathode is enhanced. As a result, the organic EL element exhibits low power consumption and high luminance.

In a preferred embodiment of the present invention, the concentration of Ag in the cathode is 25 to 70 atomic %. With this arrangement, the work function of the cathode is not more than about 3.7 eV, which is suitable for reducing the power consumption.

In a preferred embodiment of the present invention, the cathode comprises a uniform concentration layer in which Ag concentration is uniform in the thickness direction thereof and a non-uniform concentration layer which is located on an opposite side of the organic layer via the uniform concentration layer and in which Ag concentration varies in the thickness direction thereof. In this arrangement, the Ag concentration of the uniform concentration layer is set to the concentration suitable for reducing the work function. On the other hand, the Ag concentration of the non-uniform concentration layer at the portion on the opposite side of the uniform concentration layer is set to a large value suitable for preventing corrosion by e.g. the atmosphere. Thus, the organic EL element achieves both of low power consumption and environmental tolerance.

In a preferred embodiment of the present invention, the Ag concentration of the uniform concentration layer is 25 to 70 atomic %. This arrangement is preferable for reducing the power consumption of the organic EL element.

In a preferred embodiment of the present invention, the uniform concentration layer has a thickness of not less than 20 Å. With this arrangement, the electron injection efficiency from the cathode into the organic layer is reliably enhanced.

In a preferred embodiment of the present invention, the Ag concentration of the non-uniform concentration layer at a portion which is farthest from the uniform concentration layer is higher than the Ag concentration of the non-uniform concentration layer at a portion which is closest to the uniform concentration layer. With this arrangement, the organic EL element achieves both of low power consumption and environmental tolerance.

In a preferred embodiment of the present invention, the Ag concentration of the non-uniform concentration layer at the portion which is farthest from the uniform concentration layer is 100 atomic %. This arrangement is suitable for preventing the cathode from being corroded due to air, for example.

In a preferred embodiment of the present invention, the non-uniform concentration layer includes a first MgAg alloy layer, and a second MgAg alloy layer located on an opposite side of the uniform concentration layer via the first MgAg alloy layer and having an Ag concentration which is higher than an Ag concentration of the first MgAg alloy layer. With this arrangement again, the organic EL element achieves both of low power consumption and environmental tolerance.

In a preferred embodiment of the present invention, the organic EL element further comprises an Au layer located on an opposite side of the organic layer via the cathode. The total of the thickness of the cathode and the thickness of the Au layer is not more than 200 Å. This arrangement is suitable for preventing the cathode from being corroded due to air, for example. Further, the cathode and the Au layer prevent undesirable attenuation of the light emitted from the light emitting layer.

In a preferred embodiment of the present invention, the organic EL element further comprises a layer intervening between the cathode and the organic layer and containing Li. With this arrangement, the electron injection efficiency from the cathode into the organic layer is further enhanced.

According to a second aspect of the present invention, there is provided an organic EL display comprising a substrate, a plurality of organic EL elements provided according to the first aspect of the present invention and supported by the substrate, and an active matrix circuit for driving the organic EL elements for light emission. With this arrangement, the organic EL display exhibits low power consumption and high display quality.

In a preferred embodiment of the present invention, the substrate is a silicon substrate, and the active matrix circuit includes a plurality of transistors formed on the substrate. With this arrangement, the organic EL elements can be arranged with high density. Thus, the organic EL display can display fine images.

According to a third aspect of the present invention, there is provided a method for manufacturing an organic EL element. The method comprises the steps of forming an anode, forming an organic layer including a light emitting layer, and forming a cathode. The formation of the cathode is performed by co-deposition of Mg and Ag. With this method, the organic EL element according to the first aspect of the present invention is properly manufactured.

In a preferred embodiment of the present invention, the co-deposition is performed at a deposition speed of 0.1 to 1.0 Å/sec. With this arrangement, the cathode is properly manufactured without damaging the organic layer.

In a preferred embodiment of the present invention, the cathode formation step includes a step of performing co-deposition while keeping the deposition speed of Mg and the deposition speed of Ag constant and a step of performing co-deposition while increasing the ratio of the deposition speed of Ag to the deposition speed of Mg with lapse of time. With this arrangement, the cathode has a lamination structure made up of a uniform concentration layer in which the Ag concentration is uniform and a non-uniform concentration layer in which the Ag concentration increases as progressing away from the uniform concentration layer.

In a preferred embodiment of the present invention, the method for manufacturing an organic EL element further comprises the step of depositing Au on the cathode after the cathode formation step. With this arrangement, the corrosion of the cathode due to air, for example, is prevented.

In a preferred embodiment of the present invention, the method for manufacturing an organic EL element further comprises the step of forming a layer containing Li after the organic layer formation step and before the cathode formation step. This arrangement is suitable for increasing the electron injection efficiency from the cathode into the organic layer.

Other features and advantages of the present invention will become more apparent from the detailed description given below with reference to the accompanying drawings.

BEST MODE FOR CARRYING OUT THE INVENTION

Figure 1:
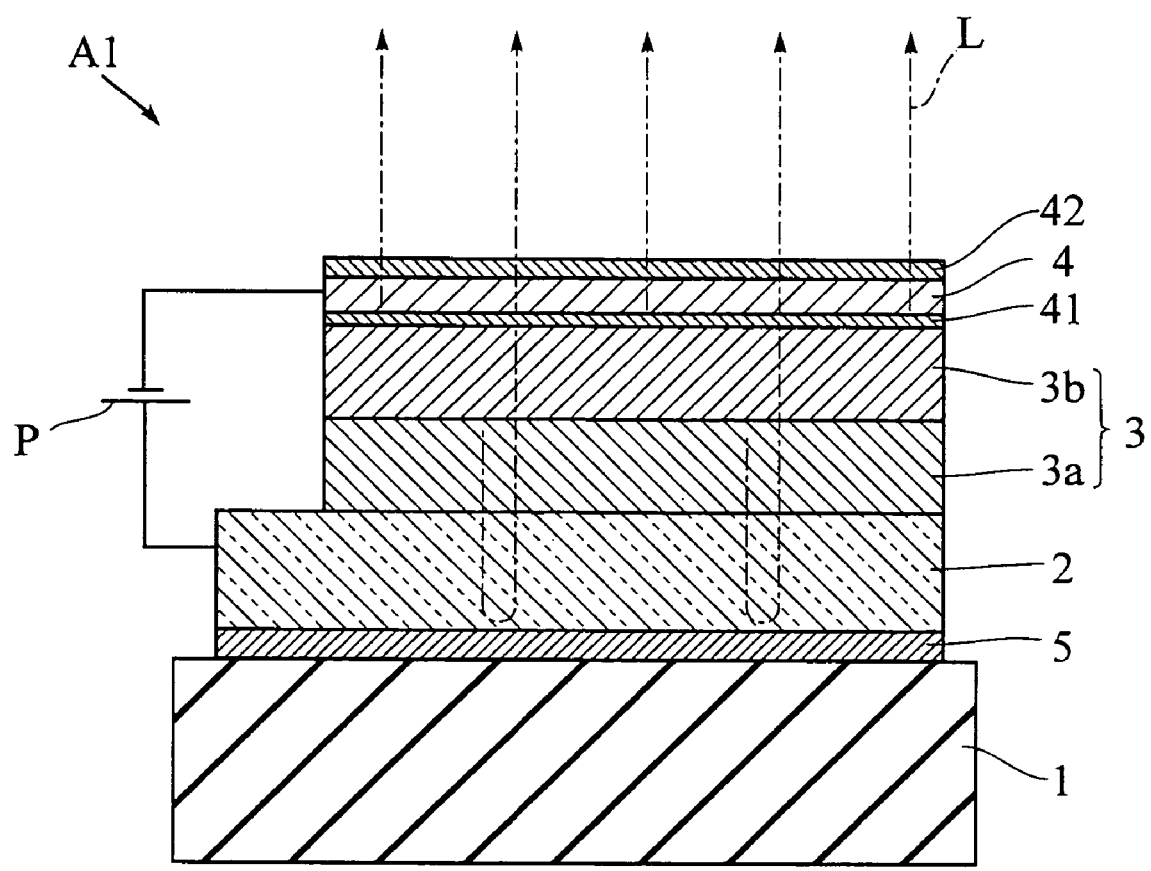
FIG. 1 is a sectional view of a principal portion of an organic EL element according to a first embodiment of the present invention.

FIG. 1 shows an organic EL element according to a first embodiment of the present invention. The substrate 1 is an insulating substrate for supporting the organic EL element A1. The organic EL element A1 is provided on the substrate 1. The organic EL element A1 includes a reflection layer 5, an anode 2, an organic layer 3 and a cathode 4.

The reflection layer 5 is formed on the substrate 1 and serves to reflect the light L traveling downward in the figure to the upper side in the figure. The reflection layer 5 has a relatively high reflectivity and is made of Al, for example.

The anode 2 is formed on the reflection layer 5 and serves to apply an electric field to the organic layer 3 to inject a hole into the organic layer 3. The anode 2 is electrically connected to the positive electrode of the power supply P. The anode 2 is transparent, has a thickness of about 1000 Å, and may be made of a material such as ITO or IZO.

The organic layer 3 is sandwiched between the anode 2 and the cathode 4 and comprises a hole transporting layer 3a and a light emitting layer 3b laminated on the hole transporting layer.

The hole transporting layer 3a transports a hole injected from the anode 2 to the light emitting layer 3b. The hole transporting layer 3a has a thickness of about 500 Å and may be made of N,N'-Bis(1-naphthyl)-N,N'-diphenyl-1,1'-biphenyl-4, 4'-diamine(α-NPD), triphenylamine derivative (TPD), or triphenylamine tetramer (TPTE).

The light emitting layer 3b is a portion for emitting light. The light emission occurs as a result of the recombination of a hole injected from the anode 2 and an electron injected from the cathode 4. The light emitting layer 3b has a thickness of about 500 Å and may be made of an aluminum complex coordinated with oxines (hereinafter referred to as "Alq$_3$"). Alq$_3$ is a material having a relatively high capability of transporting electrons.

In this way, to enhance the balance between the injection of holes and the injection of electrons, the organic layer 3 of this embodiment has a two-layer structure made up of the hole transporting layer 3a and the light emitting layer 3b. However, the structure of the organic layer of the present invention is not limited to this. For instance, the organic layer may be made up of a hole injection layer, an electron transporting layer and an electron injection layer.

An LiF layer 41 is formed on the light emitting layer 3b and has a thickness of about 5 Å.

The cathode 4 is formed on the LiF layer 41 and serves to apply an electric field to the organic layer 3 to inject an electron into the organic layer 3. The cathode 4 is electrically connected to the negative electrode of the power supply P. The cathode 4 has a thickness of about 80 Å and is made of MgAg alloy.

An Au layer 42 is formed on the cathode 4 to protect the cathode 4 from corrosion by the atmosphere. The Au layer has a thickness of about 10 Å.

Figure 2:
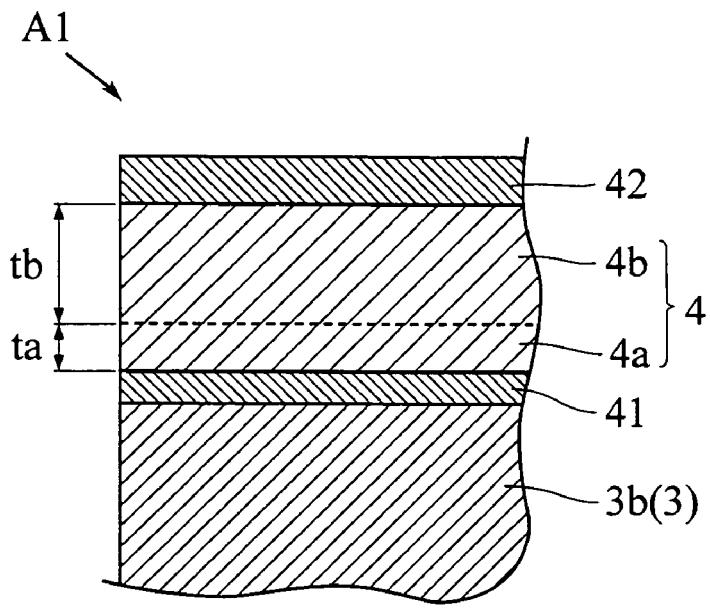
FIG. 2 is an enlarged sectional view of a principal portion of the organic EL element shown in FIG. 1.

FIG. 2 shows the specific structure of the cathode 4. The cathode 4 comprises a uniform concentration layer 4a and a non-uniform concentration layer 4b laminated on the uniform concentration layer. The uniform concentration layer 4a has a thickness ta of about 30 Å and has an Ag concentration which is uniform in the thickness direction. The non-uniform concentration layer 4b has a thickness tb of about 50 Å and has an Ag concentration which is uniform in the thickness direction.

Figure 3:
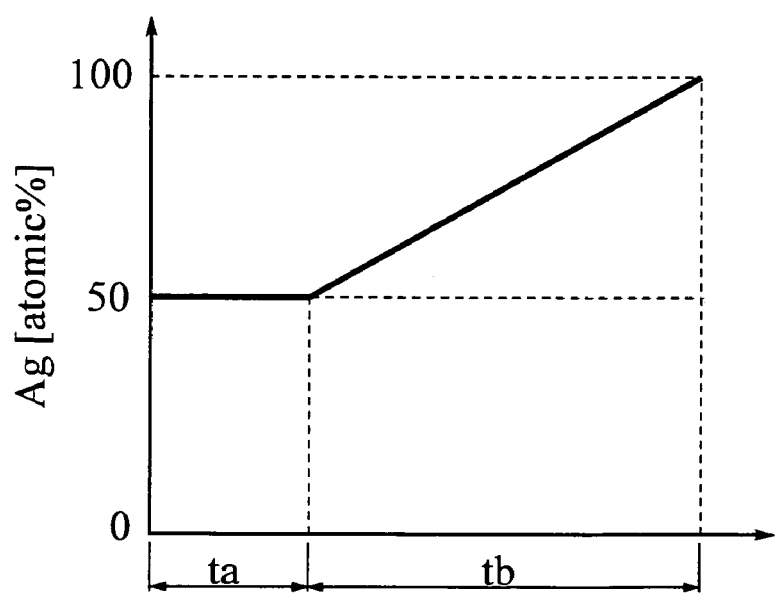
FIG. 3 is a graph showing the relationship between the thickness and Ag concentration of the cathode of the organic EL element shown in FIG. 1.

FIG. 3 is a graph showing the Ag concentration distribution in the thickness direction of the cathode 4. In the graph, the abscissa represents the thickness of the cathode 4, whereas the ordinate represents the concentration of Ag. In the uniform concentration layer 4a, the concentration of Ag has a constant value of about 50 atomic %. In the non-uniform concentration layer 4b, the concentration of Ag increases monotonically as progressing away from the uniform concentration layer 4a. The Ag concentration of the non-uniform concentration layer 4b at the portion adjoining the uniform concentration layer 4a is substantially equal to that of the uniform concentration layer, i.e., about 50 atomic %. The Ag concentration of the non-uniform concentration layer 4b at the portion which is farthest from the uniform concentration layer 4a is about 100 atomic %.

Figure 4:
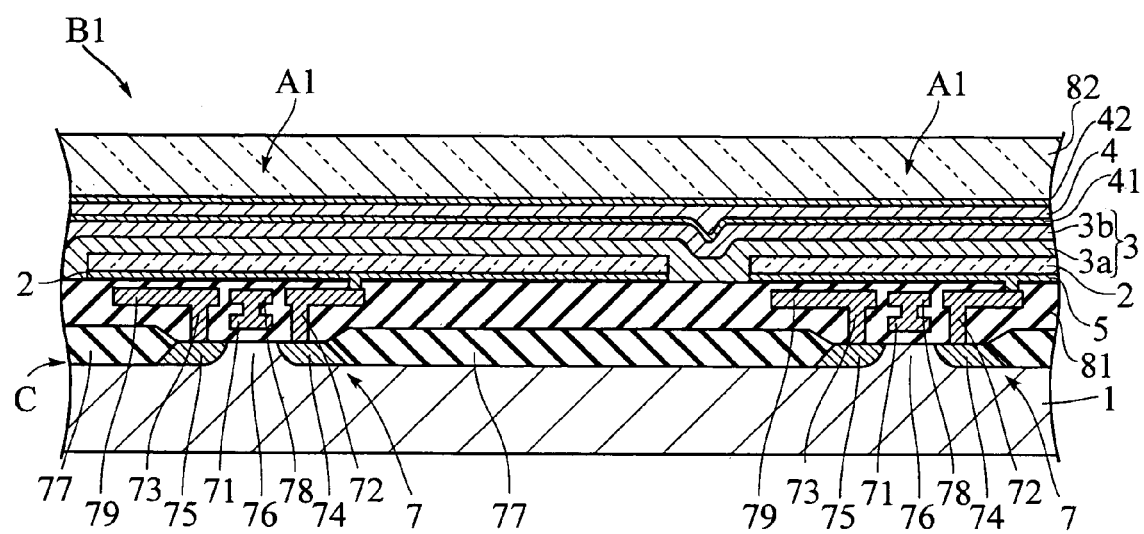
FIG. 4 is a sectional view of a principal portion of an organic EL display using the organic EL element shown in FIG. 1.

FIG. 4 shows an example of organic EL display employing the organic EL element Al. The organic EL display Bl includes a substrate 1, an active matrix circuit C, an insulating layer 81, a field oxide film 77, a plurality of organic EL elements Al arranged in matrix and a protective layer 82. The organic EL display Bl displays an image to be viewed from above in the figure.

The substrate 1 may be a single crystal silicon substrate.

The active matrix circuit C is formed on the substrate 1 to drive the organic EL elements Al for light emission. The active matrix circuit C includes a plurality of transistors 7, a gate wiring 78, a data wiring 79 and other wirings (not shown).

The transistors 7 perform switching of the organic EL elements Al. Each of the transistors 7 is a MOS (Metal Oxide Semiconductor) transistor including a gate electrode 71, a source electrode 72, a drain electrode 73, an N$^+$ source region 74, an N$^+$ drain region 75 and a channel region 76.

The gate electrode 71 serves to produce an electric field to act on the channel region 76. The gate electrode 71 is provided above the channel region 76 via the insulating layer 81 and electrically connected to the gate wiring 78. The source electrode 72 is electrically connected to the anode 2 via the reflection layer 5 of the organic EL element Al. The drain electrode 73 is electrically connected to the data wiring 79.

By setting the potential to be applied to the gate electrode 71 high or low, the transistor 7 is switched ON or OFF. When the transistor 7 is ON, the source electrode 72 and the drain electrode 73 are electrically connected to each other. As a result, an electric field is applied to the organic EL element Al, whereby the organic EL element Al emits light.

The transistors 7 are covered by the insulating layer 81. Adjacent ones of the transistors 7 are insulated from each other by the field oxide film 77.

The organic EL elements Al are arranged in matrix on the insulating layer 81. Each of the organic EL elements Al has the structure as described with-reference to FIG. 1. The cathode 4 functions as a common electrode for all of the organic EL elements Al of the organic EL display Bl.

The protective layer 82 is formed to cover the organic EL elements Al. The protective layer 82 has a relatively high transmittance and may be made of glass mixed with desiccant, and ultraviolet curing resin for sealing the glass.

An example of method for manufacturing the organic EL display Bl will be described below with reference to FIGS. 5-8. The manufacturing method includes the process steps for manufacturing the organic EL element Al.

Figure 5:
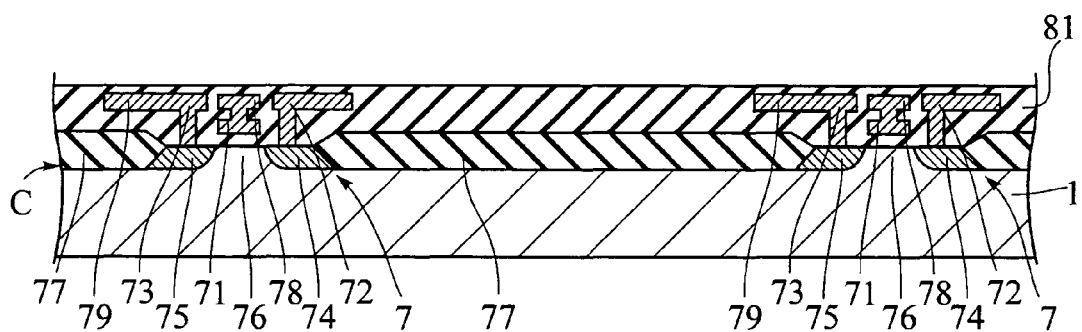
FIG. 5 is a sectional view of a principal portion for describing the step of forming an active matrix circuit in a method for manufacturing the organic EL display shown in FIG. 4.

First, as shown in FIG. 5, a substrate 1 of single crystal silicon is prepared. Then, an active matrix circuit C including a plurality of transistors 7, an insulating layer 81 and a field oxide film 77 are formed on the substrate 1.

Figure 6:
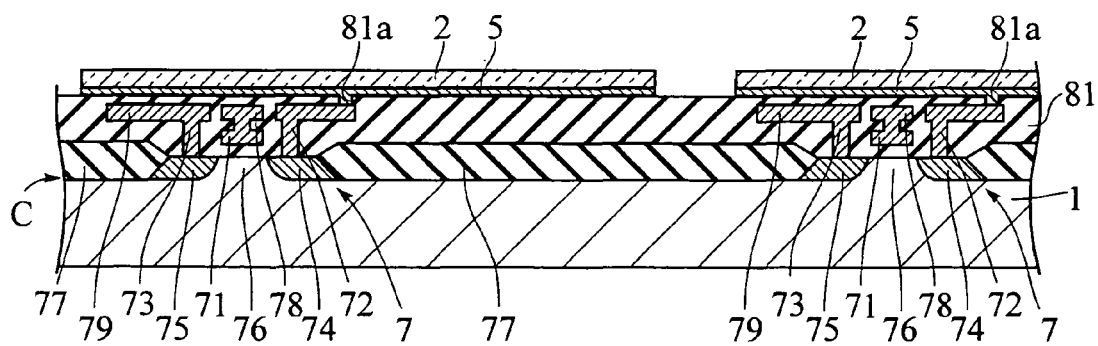
FIG. 6 is a sectional view of a principal portion for describing the step of forming an anode in a method for manufacturing the organic EL display shown in FIG. 2.

Then, as shown in FIG. 6, a plurality of reflection layers 5 and a plurality of anodes 2a reformed. The process steps are as follows. First, a plurality of contact holes 81a reaching the source electrodes 72 are formed in the insulating substrate 81. Then, a thin film of Al is formed on the insulating substrate 81 by e.g. sputtering using Al. Then, a thin film of ITO having a thickness of about 1000 Å is formed on the thin film of Al by sputtering, MBE or ion plating, for example. Then, these thin films are patterned by e.g. photolithography, whereby a plurality of reflection layers 5 and a plurality of anodes 2 are provided. Each of the reflection layers 5 is so formed as to include a region entering the contact hole 81a. Thus, each of the anodes 2 is electrically connected to a corresponding one of the source electrodes 72.

Figure 7:
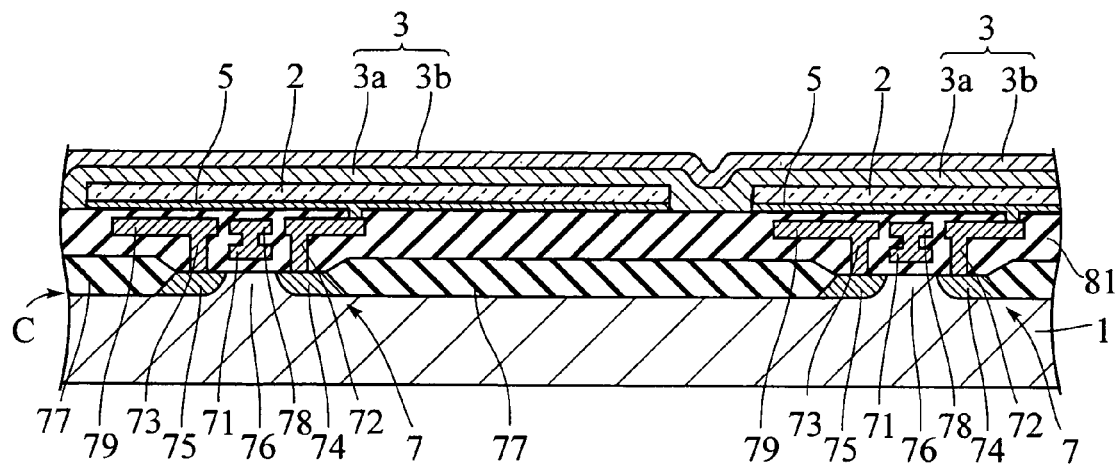
FIG. 7 is a sectional view of a principal portion for describing the step of forming an organic layer in a method for manufacturing the organic EL display shown in FIG. 4.

Then, as shown in FIG. 7, an organic layer 3 is formed. The process steps are as follows. First, by vacuum deposition using α-NPD, a hole transporting layer 3a having a thickness of about 500 Å is formed to cover the anodes 2 and the insulating layer 81. As the material of the hole transporting layer 3a, TPD or TPTE may be used instead of α-NPD. Then, by vacuum deposition using Alq$_3$, a light emitting layer 3b having a thickness of about 500 Å is formed on the hole transporting layer 3a.

Figure 8:
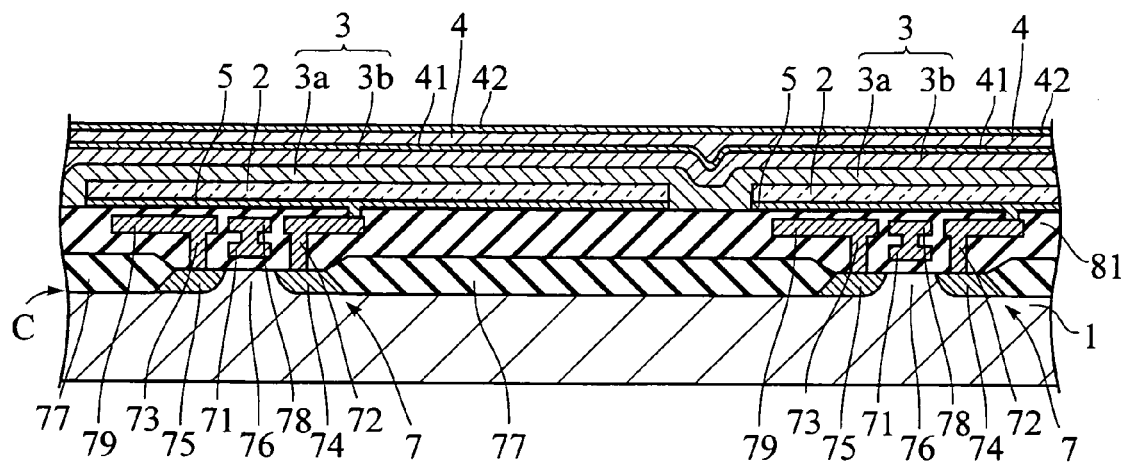
FIG. 8 is a sectional view of a principal portion for describing the step of forming a cathode in a method for manufacturing the organic EL display shown in FIG. 4.

Then, as shown in FIG. 8, an LiF layer 41 is formed. The LiF layer 41 is formed to have a thickness of about 5 Å by e.g. vacuum deposition.

Then, as shown in the figure, a cathode 4 is formed. The cathode 4 may be formed by co-deposition using Mg and Ag as the deposition source. Specifically, first, co-deposition is performed, with the deposition speed of Mg and the deposition speed of Ag set to 1:1, whereby a uniform concentration layer 4a is formed. The uniform concentration layer is formed to have the Ag concentration of about 50 atomic % and a thickness of about 30 Å. Then, co-deposition is performed while gradually changing the ratio of the deposition speed of Mg and that of Ag from 1:1 to 0:1. That is, with the deposition speed of Ag kept constant, the deposition speed of Mg is linearly reduced toward 0 with the lapse of time. As a result, as shown in FIG. 3, a non-uniform concentration layer 4b in which the Ag concentration linearly changes from 50 atomic % to 100 atomic % in the thickness direction is obtained. The non-uniform concentration layer 4b is formed to have a thickness of about 50 Å. Preferably, the deposition speed in the co-deposition is about 0.1 to 1.0 Å/sec.

Then, as shown in the figure, an Au layer 42 is formed. The Au layer 42 is formed to have a thickness of about 10 Å by e.g. vacuum deposition.

Finally, a protective layer 82 shown in FIG. 4 is formed. The process steps are as follows. First, the Au layer 42 is covered with glass mixed with desiccant. Then, the glass is sealed with ultraviolet curing resin. By the above-described process, an organic EL display Bl using a plurality of organic EL elements Al is obtained.

The operation and advantages of the organic EL element Al and the organic EL display Bl using the organic EL element Al will be described below.

According to this embodiment, the cathode 4 is formed by vapor deposition. Thus, the organic layer 3 is prevented from being damaged physically or chemically. Particularly, the formation of the cathode 4 by vapor deposition at the deposition speed of about 0.1 to 1.0 Å/sec is preferable for preventing damages to the organic layer 3.

Since the organic layer 3 is not damaged, electron injection into the organic layer 3 is performed properly, and reduction of light emission from the light emitting layer 3 is prevented. As a result, the organic EL element Al has low power consumption and high luminance. By using such an organic EL element Al, the organic EL display Bl exhibits low power consumption and high display quality.

Figure 9:
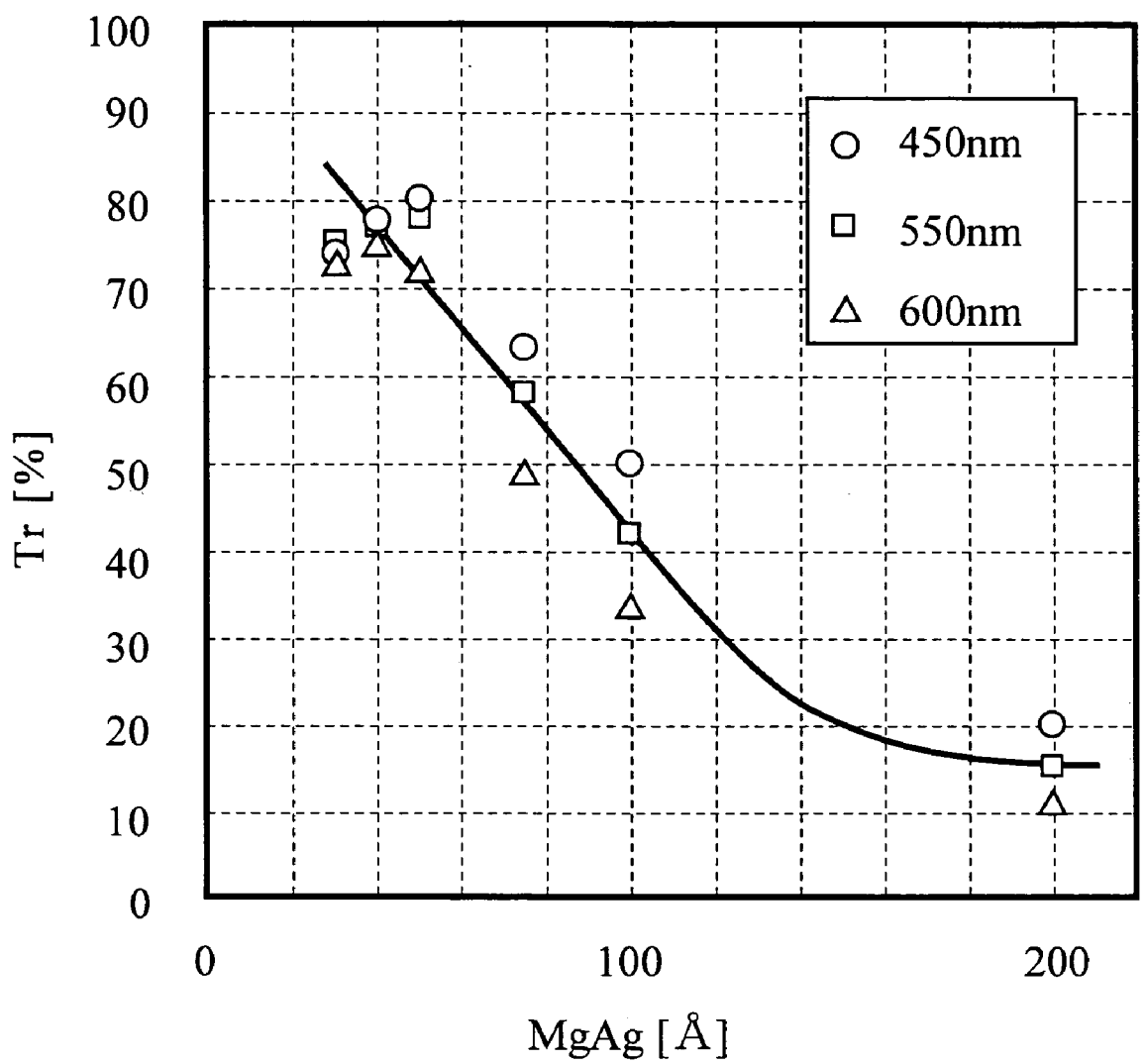
FIG. 9 is a graph showing the transmittance of MgAg alloy.

FIG. 9 shows the relationship between the thickness of MgAg alloy and transmittance (Tr). MgAg alloy is the material of the cathode 4. Three kinds of dots in the figure indicate the transmittances with respect to the lights having the wavelengths of 450 nm, 550 nm and 600 nm, respectively. As will be understood from the figure, when the thickness of the cathode 4 is about 80 Å, the transmittance of the cathode 4 is about 55%. When the cathode has this level of transmittance, the light L from the light emitting layer 4b is properly transmitted to the upper side in FIG. 1. Thus, the cathode 4 having the thickness of about 80 Å is suitable for providing a top emission organic EL element Al having high luminance and an organic EL display Bl having high display quality. Further, as a result of the study performed by the inventors of the present invention, it has been found that, to achieve a high luminance of the organic EL element Al and a high display quality of the organic EL display Bl, the cathode 4 needs to have a transmittance of at least about 15%, and preferably, not less than about 40%. Thus, it is concluded that the function of light emission by the organic EL element Al is properly exhibited when the thickness of the cathode 4 is not more than 200 Å. A cathode 4 having a thickness of not more than 100 Å is further preferable.

Figure 10:
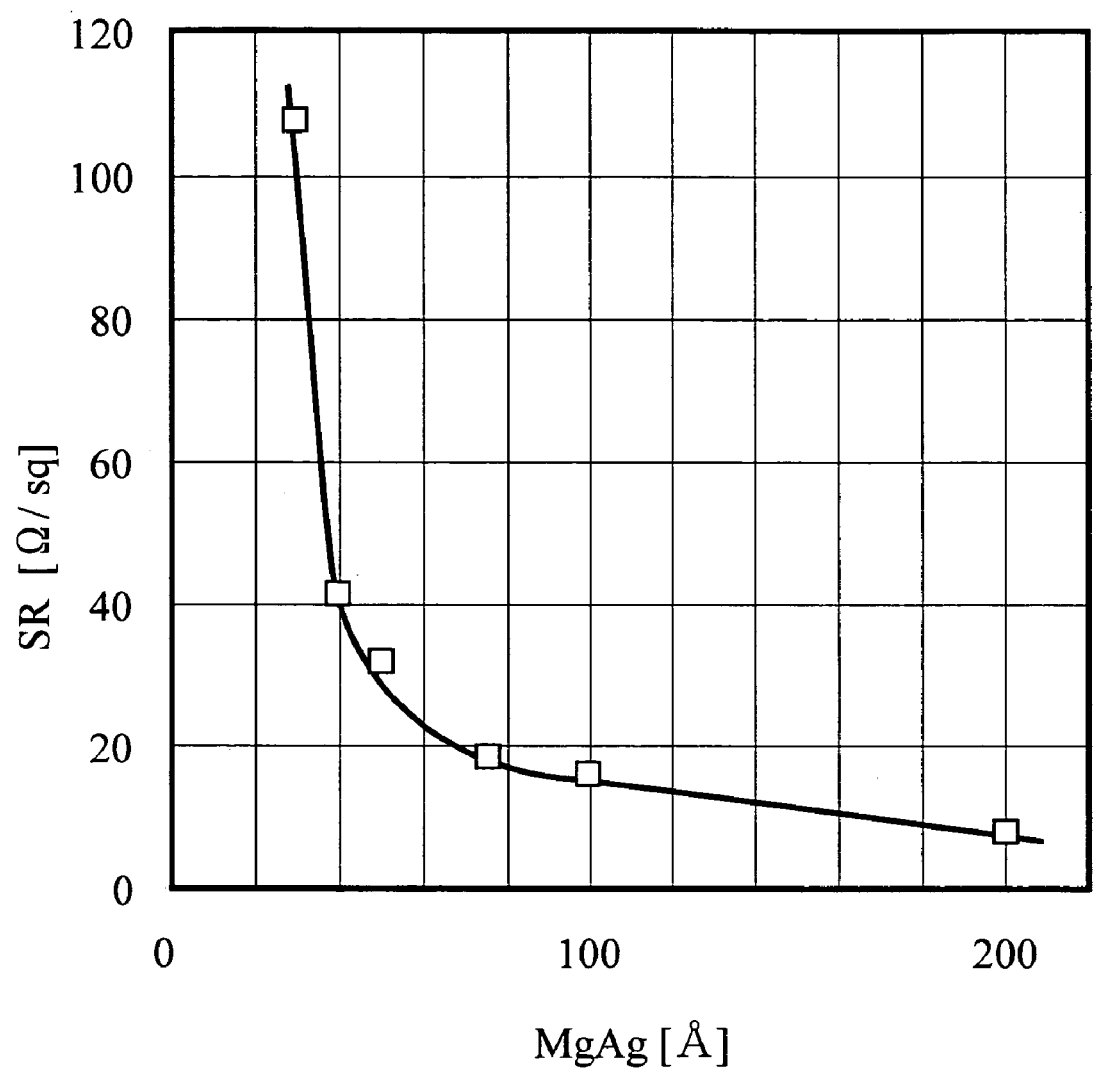
FIG. 10 is a graph showing the sheet resistance of MgAg alloy.

FIG. 10 shows the relationship between the thickness of MgAg alloy and sheet resistance (SR). As will be understood from the figure, when the thickness of the cathode 4 is about 80 Å, the sheet resistance of the cathode 4 is about 18 Ω/sq. The lower the sheet resistance is, the higher the efficiency of electron injection from the cathode 4 into the organic layer 3 is. The sheet resistance of the cathode 4 of this embodiment is generally equal to or lower than that of a typical cathode made of ITO. Thus, the power consumption of the organic EL element Al and the organic EL display Bl is low. Further, as a result of the study performed by the inventors of the present invention, it has been found that, to achieve the low power consumption of the organic EL element Al and the organic EL display Bl, it is necessary that the cathode 4 has a sheet resistance of not more than 40 Ω/sq. Thus, it is preferable that the thickness of the cathode 4 is not less than 40 Å.

As will be understood from the above, to achieve both of high luminance and low power consumption, it is preferable that the thickness of the cathode 4 is about 40 to 100 Å.

Figure 11:
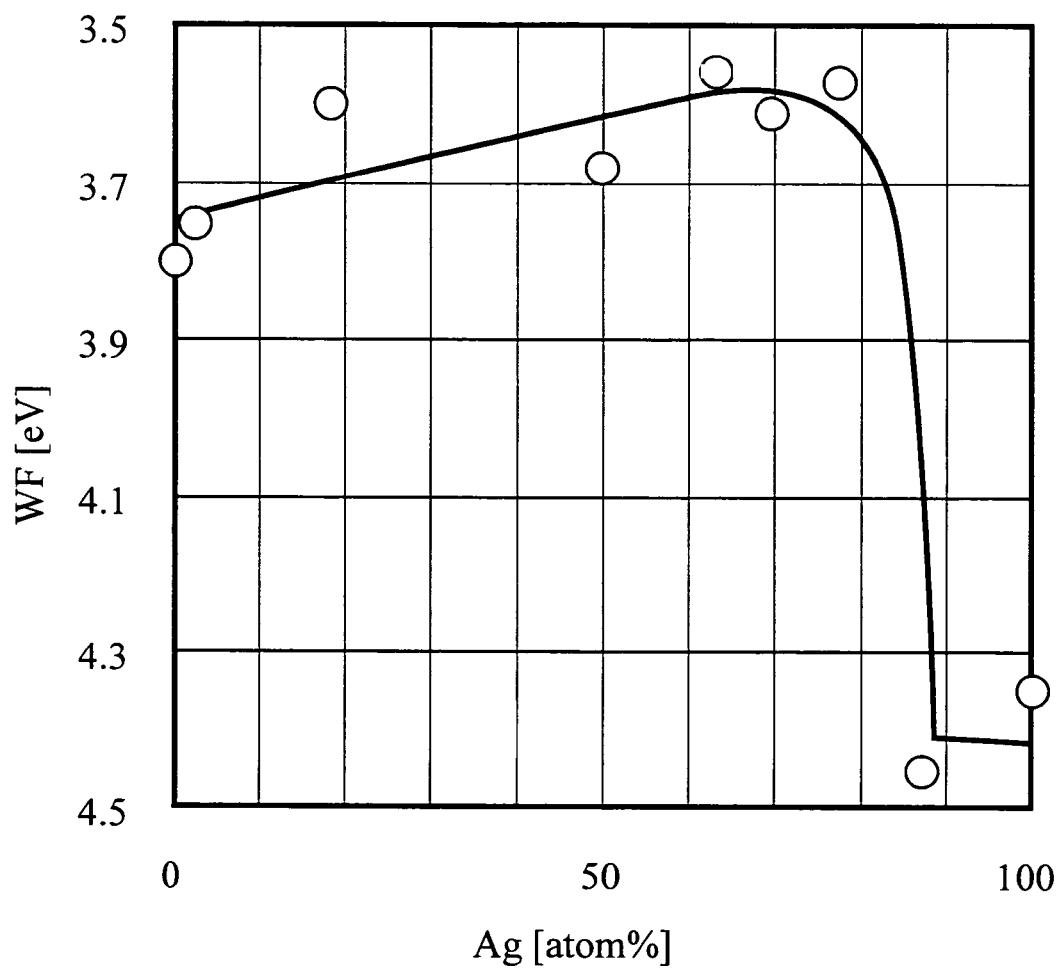
FIG. 11 is a graph showing the work function of MgAg alloy.

FIG. 11 shows the relationship between the concentration of Ag in MgAg alloy and work function (WF) As will be understood from the figure, as the concentration of Ag in MgAg alloy increases from 0 atomic %, the work function gradually reduces from about 3.8 eV. When the Ag concentration is about 70 atomic %, the work function has the lowest value of about 3.6 eV. When the Ag concentration further increases and exceeds about 80 atomic %, the work function becomes extremely high. In this embodiment, the Ag concentration of the uniform concentration layer 4a, which is positioned on the organic layer 3 side, is about 50 atomic %, so that the uniform concentration layer 4a has a relatively low work function of about 3.65 eV. When the work function is low, the efficiency of electron injection into the organic layer 3 is high, so that the power consumption of the organic EL element Al and the organic EL display Bl is low. To enhance the electron injection efficiency from the cathode 4 into the organic layer 3, it is preferable that the Ag concentration of the cathode 4 is 25 to 75 atomic % at least at the portion on the organic layer 3 side. In this case, the work function of the cathode 4 at the portion on the organic layer 3 side is not more than about 3.7 eV. It is to be noted that, preferably, the thickness of the uniform concentration layer 4a is not less than 20 Å.

As shown in FIG. 3, the Ag concentration of the cathode 4 at the portion adjoining the Au layer 42 is 100 atomic %. This prevents the corrosion by the atmosphere in the process of manufacturing the organic EL element Al, for example. Thus, the environmental tolerance of the cathode 4 is enhanced, and hence the deterioration of the organic EL element Al or organic EL display Bl during the manufacturing process or the deterioration due to long use are suppressed. Since the cathode 4 has a lamination structure made up of the uniform concentration layer 4a and the non-uniform concentration layer 4b, the enhancement of both of the electron injection efficiency and the environmental tolerance is achieved. When the Ag concentration of the cathode 4 at the portion adjoining the Au layer 42 is higher than the Ag concentration of the uniform concentration layer 4a, the environmental tolerance is further enhanced. It is more preferable that the Ag concentration at this portion is 100 atomic %.

The Au layer 42 covering the cathode 4 functions to prevent the cathode 4 from being corroded by e.g. air. When the total of the thickness of the Au layer 42 and that of the cathode 4 is not more than 200 Å, the transmittance of the lamination product made up of the Au layer 42 and the cathode 4 is about 15%. In this case, the light emission function of the organic EL element Al is properly exhibited.

The LiF layer containing Li and intervening between the organic layer 3 and the cathode 4 functions as a buffer layer and enhances the electron injection efficiency from the cathode 4 into the organic layer 3.

Figure 12:
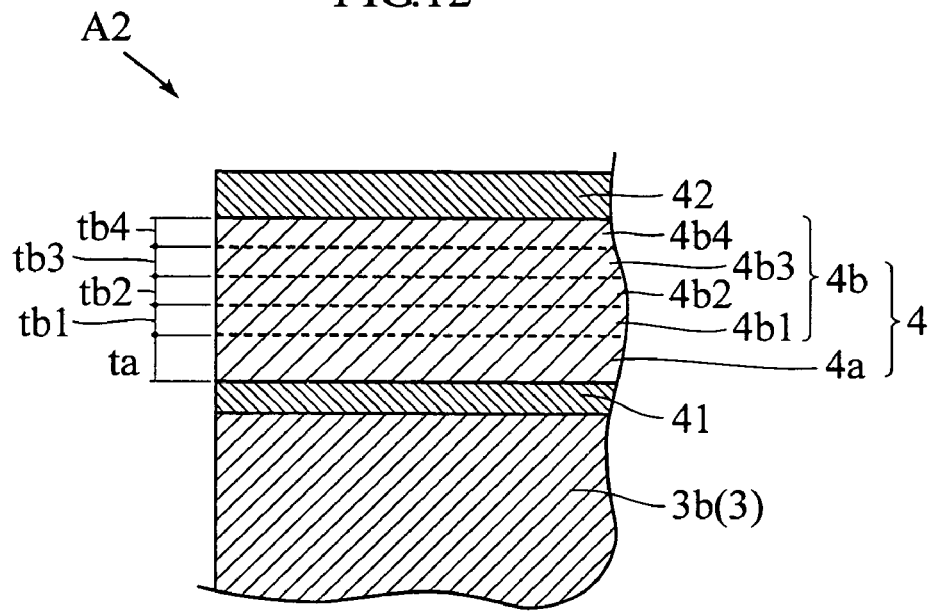
FIG. 12 is a sectional view of a principal portion of an organic EL element according to a second embodiment of the present invention.
Figure 13:
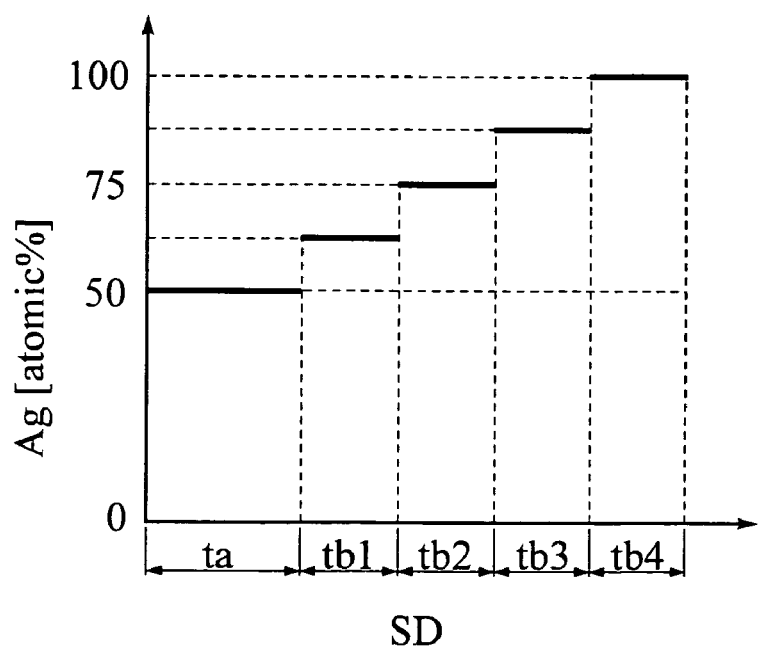
FIG. 13 is a graph showing the relationship between the thickness and Ag-concentration of the cathode of the organic EL element shown in FIG. 12.
Figure 14:
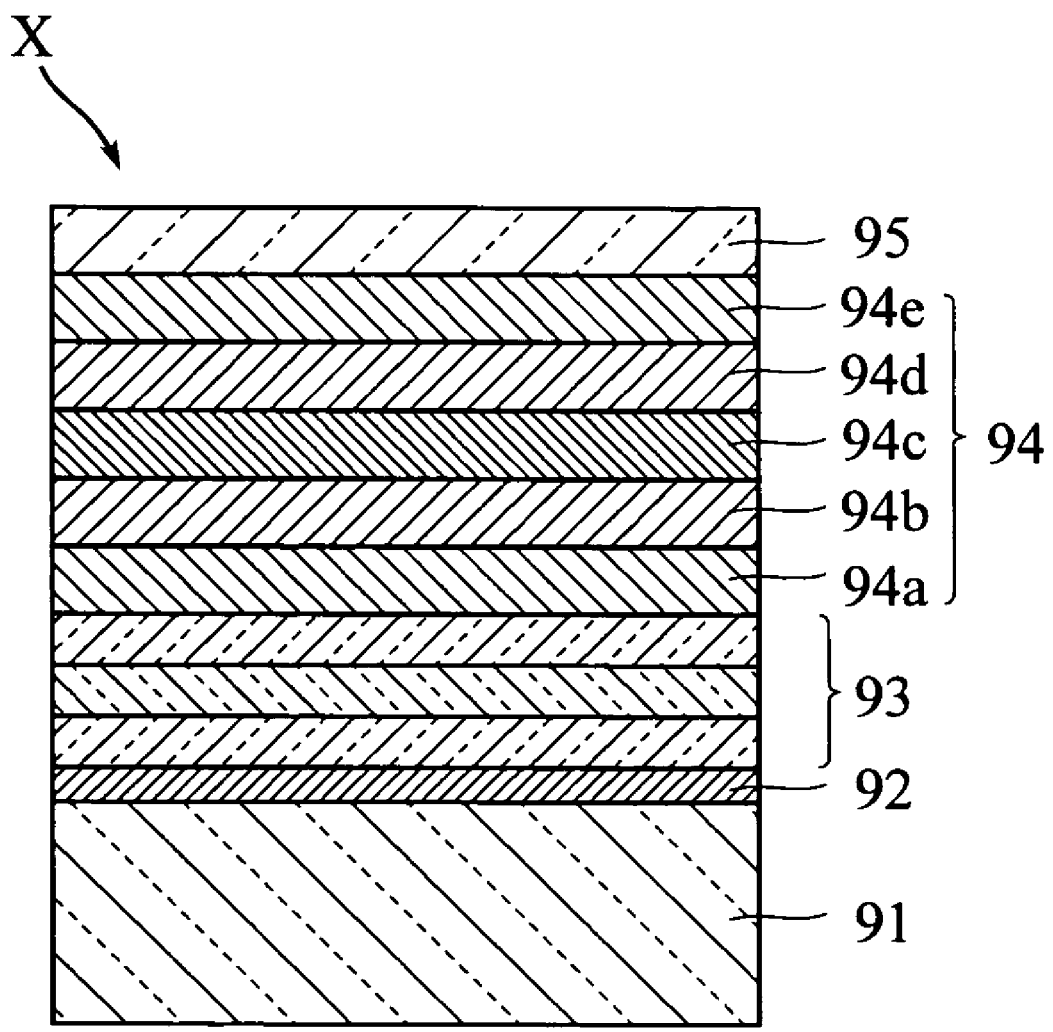
FIG. 14 is a sectional view showing a principal portion of an example of conventional organic EL element.

FIGS. 12 and 13 show an organic EL element according to a second embodiment of the present invention. In these figures, the elements which are identical or similar to those of the first embodiment are designated by the same reference signs as those used for the first embodiment.

The organic EL element A2 of this embodiment differs from that of the first embodiment in that the non-uniform concentration layer 4b of the cathode 4 is made up of a plurality of MgAg alloy layers. Other structural elements are the same as those of the organic EL element Al shown in FIG. 1. As shown in FIG. 12, the non-uniform concentration layer 4b has a lamination structure made up of MgAg alloy layers 4b1, 4b2, 4b3 and 4b4 which are generally equal to each other in thickness. As shown in FIG. 13, the concentration of Ag in the non-uniform concentration layer 4b increases stepwise as the distance (SD) from the uniform concentration layer 4a increases. The non-uniform concentration layer 4b may be formed by co-deposition of Mg and Ag. Specifically, the non-uniform concentration layer 4b having the Ag concentration distribution shown in FIG. 13 is obtained by performing co-deposition while keeping the deposition speed of Ag constant and reducing the deposition concentration of Mg stepwise with the lapse of time.

In this embodiment again, the electron injection efficiency is enhanced by the uniform concentration layer 4a, and the environmental tolerance of the cathode 4 is enhanced.

The organic EL element, the organic EL display and the method for manufacturing an organic EL element according to the present invention is not limited to the foregoing embodiments. The specific structure of each part of the organic EL element and the organic EL display may be varied in design in various ways. Each of the process steps of the method for manufacturing an organic EL element according to the present invention may be varied in various ways.

It is preferable that the cathode has a lamination structure made up of a uniform concentration layer and a non-uniform concentration layer. However, the Ag concentration may be uniform throughout the entirety of the cathode. In such a case again, to enhance the electron injection efficiency, it is preferable that the Ag concentration is 25 to 70 atomic %. Alternatively, the Ag concentration may be non-uniform throughout the entirety of the cathode. In such a case again, it is preferable that the Ag concentration of the cathode at the portion on the organic layer side is 25 to 70 atomic %, whereas the Ag concentration of the cathode at the portion which is farthest from the organic layer is about 100 atomic %.

The invention claimed is:

1. An organic EL element comprising:
   an anode and a cathode facing each other; and
   an organic layer arranged between the anode and the cathode and including a light emitting layer;
   wherein the cathode is made of MgAg alloy and has a thickness of not more than 200 Å; and
   wherein the cathode comprises a uniform concentration layer in which Ag concentration is uniform in a thickness direction thereof and a non-uniform concentration layer which is located on an opposite side of the organic layer via the uniform concentration layer and in which Ag concentration varies in a thickness direction thereof.

2. The organic EL element according to claim 1, wherein the cathode has a thickness of 40 to 100 Å.

3. The organic EL element according to claim 1, wherein concentration of Ag in the cathode is 25 to 70 atomic %.

4. The organic EL element according to claim 1, wherein the Ag concentration of the uniform concentration layer is 25 to 70 atomic %.

5. The organic EL element according to claim 1, wherein the uniform concentration layer has a thickness of not less than 20 Å.

6. The organic EL element according to claim 1, wherein the Ag concentration of the non-uniform concentration layer at a portion which is farthest from the uniform concentration layer is higher than the Ag concentration of the non-uniform concentration layer at a portion which is closest to the uniform concentration layer.

7. The organic EL element according to claim 6, wherein the Ag concentration of the non-uniform concentration layer at the portion which is farthest from the uniform concentration layer is 100 atomic %.

8. The organic EL element according to claim 6, wherein the non-uniform concentration layer includes a first MgAg alloy layer, and a second MgAg alloy layer located on an opposite side of the uniform concentration layer via the first MgAg alloy layer and having an Ag concentration which is higher than an Ag concentration of the first MgAg alloy layer.

9. The organic EL element according to claim 1, further comprising an Au layer located on an opposite side of the organic layer via the cathode, wherein total of thickness of the cathode and thickness of the Au layer is not more than 200 Å.

10. The organic EL element according to claim 1, further comprising a layer intervening between the cathode and the organic layer and containing Li.

11. An organic EL display comprising:
    a substrate;
    a plurality of organic EL elements supported by the substrate; and
    an active matrix circuit for driving the organic EL elements for light emission;
    wherein each of the organic EL elements includes an anode and a cathode which are arranged opposite to each other, and an organic layer intervening between the anode and the cathode and including a light emitting layer,
    wherein the cathode is made of MgAg alloy and has a thickness of not more than 200 Å, and
    wherein the cathode comprises a uniform concentration layer in which Ag concentration is uniform in a thickness direction thereof and a non-uniform concentration layer which is located on an opposite side of the organic layer via the uniform concentration layer and in which Ag concentration varies in a thickness direction thereof.

12. The organic EL display according to claim 11 wherein the substrate is made of silicon, and wherein the active matrix circuit includes a plurality of transistors formed on the substrate.

13. A method for making an organic EL element, the method comprising the steps of:
    forming an anode;
    forming an organic layer including a light emitting layer; and
    forming a cathode;
    wherein the formation of the cathode is performed by co-deposition of Mg and Ag; and
    wherein the co-deposition is performed at a deposition speed of 0.1 to 1.0 Å/sec.

14. The method for manufacturing an organic EL element according to claim 13 wherein the cathode formation step includes a step of performing co-deposition while keeping deposition speed of Mg and deposition speed of Ag constant and a step of performing co-deposition while increasing ratio of deposition speed of Ag to deposition speed of Mg with lapse of time.

15. The method for manufacturing an organic EL element according to claim 13, further comprising the step of depositing Au on the cathode after the cathode formation step.

16. The method for manufacturing an organic EL element according to claim 13 further comprising the step of forming a layer containing Li after the organic layer formation step and before the cathode formation step.

17. A method for making an organic EL element, the method comprising the steps of:
   forming an anode;
   forming an organic layer including a light emitting layer; and
   forming a cathode;
   wherein the formation of the cathode is performed by co-deposition of Mg and Ag; and
   wherein the cathode formation step includes a step of performing co-deposition while keeping deposition speed of Mg and deposition speed of Ag constant and a step of performing co-deposition while increasing ratio of deposition speed of Ag to deposition speed of Mg with lapse of time.

* * * * *